(12) United States Patent
Smirnov et al.

(10) Patent No.: US 7,110,082 B2
(45) Date of Patent: Sep. 19, 2006

(54) OPTICAL SYSTEM FOR MASKLESS LITHOGRAPHY

(75) Inventors: Stanislav Smirnov, Bethel, CT (US); Mark Oskotsky, Mamaroneck, NY (US)

(73) Assignee: ASML Holding N.V., Veldhoven (NL)

( * ) Notice: Subject to any disclaimer, the term of this patent is extended or adjusted under 35 U.S.C. 154(b) by 134 days.

(21) Appl. No.: 10/602,069

(22) Filed: Jun. 24, 2003

(65) Prior Publication Data

US 2004/0263813 A1    Dec. 30, 2004

(51) Int. Cl.
G03B 27/42 (2006.01)
G03B 27/58 (2006.01)
G03B 27/54 (2006.01)
G03F 9/00 (2006.01)

(52) U.S. Cl. .......................... 355/53; 355/47; 355/67; 430/5

(58) Field of Classification Search .................. 355/47, 355/53, 75, 67; 430/5, 22, 30; 359/223, 359/291, 295, 298
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,691,541 A * | 11/1997 | Ceglio et al. | 250/492.1 |
| 5,808,797 A | 9/1998 | Bloom et al. | |
| 5,982,553 A | 11/1999 | Bloom et al. | |
| 6,133,986 A * | 10/2000 | Johnson | 355/67 |
| 6,177,980 B1 | 1/2001 | Johnson | |
| 6,291,110 B1 * | 9/2001 | Cooper et al. | 430/5 |
| 6,373,619 B1 | 4/2002 | Sandstrom | |
| 6,416,908 B1 * | 7/2002 | Klosner et al. | 430/5 |
| 6,624,880 B1 * | 9/2003 | Sandstrom et al. | 355/71 |
| 6,687,041 B1 | 2/2004 | Sandstrom | |
| 6,707,534 B1 * | 3/2004 | Bjorklund et al. | 355/53 |
| 6,747,783 B1 | 6/2004 | Sandstrom | |
| 6,795,169 B1 | 9/2004 | Tanaka et al. | |
| 6,806,897 B1 | 10/2004 | Kataoka et al. | |
| 6,811,953 B1 | 11/2004 | Hatada et al. | |
| 2001/0045690 A1 | 11/2001 | Brandinger | |
| 2003/0030781 A1 * | 2/2003 | Bleeker et al. | 355/67 |
| 2004/0041104 A1 | 3/2004 | Liebregts et al. | |
| 2004/0130561 A1 | 7/2004 | Jain | |
| 2005/0007572 A1 | 1/2005 | George et al. | |

FOREIGN PATENT DOCUMENTS

WO    WO 98/33096    7/1998

(Continued)

OTHER PUBLICATIONS

Search Report from Singapore Patent Application No. 2004031819-6, dated Jan. 20, 2005, 7 pages.

*Primary Examiner*—Alan Mathews
(74) *Attorney, Agent, or Firm*—Sterne, Kessler, Goldstein & Fox P.L.L.C.

(57) ABSTRACT

A maskless lithography system including an illuminating system, a SLM having a non-linear shape (e.g., curved, concave, spherical, etc.), an exposure system, and a beam splitter that directs light from the illuminating system to the SLM and from the SLM to the exposure system. In some embodiments, an optical element can be located between the beam splitter and the SLM, possibly to correct for aberrations.

6 Claims, 3 Drawing Sheets

FOREIGN PATENT DOCUMENTS

| WO | WO 98/38597 | 9/1998 |
| WO | WO 00/03307 | 1/2000 |

* cited by examiner

OPTICAL SYSTEM FOR MASKLESS LITHOGRAPHY

BACKGROUND OF THE INVENTION

1. Field of the Invention

The present invention relates generally to lithography. More particularly, the present invention relates to maskless lithography.

2. Related Art

Lithography is a process used to create features on the surface of substrates. Such substrates can include those used in the manufacture of flat panel displays (e.g., liquid crystal displays), circuit boards, various integrated circuits, and the like. A frequently used substrate for such applications is a semiconductor wafer or glass substrate. While this description is written in terms of a semiconductor wafer for illustrative purposes, one skilled in the art would recognize that this description also applies to other types of substrates known to those skilled in the art.

During lithography, a wafer, which is disposed on a wafer stage, is exposed to an image projected onto the surface of the wafer by exposure optics located within a lithography apparatus. While exposure optics are used in the case of photolithography, a different type of exposure apparatus can be used depending on the particular application. For example, x-ray, ion, electron, or photon lithography each can require a different exposure apparatus, as is known to those skilled in the art. The particular example of photolithography is discussed here for illustrative purposes only.

The projected image produces changes in the characteristics of a layer, for example photoresist, deposited on the surface of the wafer. These changes correspond to the features projected onto the wafer during exposure. Subsequent to exposure, the layer can be etched to produce a patterned layer. The pattern corresponds to those features projected onto the wafer during exposure. This patterned layer is then used to remove or further process exposed portions of underlying structural layers within the wafer, such as conductive, semiconductive, or insulative layers. This process is then repeated, together with other steps, until the desired features have been formed on the surface, or in various layers, of the wafer.

Step-and-scan technology works in conjunction with a projection optics system that has a narrow imaging slot. Rather than expose the entire wafer at one time, individual fields are scanned onto the wafer one at a time. This is accomplished by moving the wafer and reticle simultaneously such that the imaging slot is moved across the field during the scan. The wafer stage must then be asynchronously stepped between field exposures to allow multiple copies of the reticle pattern to be exposed over the wafer surface. In this manner, the quality of the image projected onto the wafer is maximized.

Conventional lithographic systems and methods form images on a semiconductor wafer. The system typically has a lithographic chamber that is designed to contain an apparatus that performs the process of image formation on the semiconductor wafer. The chamber can be designed to have different gas mixtures and/or grades of vacuum depending on the wavelength of light being used. A reticle is positioned inside the chamber. A beam of light is passed from an illumination source (located outside the system) through an optical system, an image outline on the reticle, and a second optical system before interacting with a semiconductor wafer.

A plurality of reticles is required to fabricate a device on the substrate. These reticles are becoming increasingly costly and time consuming to manufacture due to the feature sizes and the exacting tolerances required for small feature sizes. Also, a reticle can only be used for a certain period of time before being worn out. Further costs are routinely incurred if a reticle is not within a certain tolerance or when the reticle is damaged. Thus, the manufacture of wafers using reticles is becoming increasingly, and possibly prohibitively, expensive.

In order to overcome these drawbacks, maskless (e.g., direct write, digital, etc.) lithography systems have been developed. The maskless system replaces a reticle with a spatial light modulator (SLM) (e.g., a digital micro mirror device (DMD), a liquid crystal display (LCD), or the like). The SLM includes an array of active areas (e.g., mirrors or transmissive areas) that are either ON or OFF to form a desired pattern. A predetermined and previously stored algorithm based on a desired exposure pattern is used to turn ON and OFF the active areas.

FIG. 1 shows a conventional SLM-based writing system 100 using a flat SLM 102 as a pattern generator. Light from illumination system 104 is directed to SLM 102 via a beam splitter 106 and an optical system (not shown) that contains at least an optical element 108. After reflecting from SLM 102, light is passed through beam splitter 106 and directed to a substrate 110 via an optical system (not shown) having at least an optical element 112. In order to maintain a double telecentric beam towards SLM 102 and substrate 110, optical element 108 must have a same diameter as SLM 102. Beams can be considered double telecentric when a chief ray of each beam is parallel to an optical axis of the SLM 102 and/or parallel to an optical axis of the substrate 110. There are manufacturing limits as to how large a diameter optical element 108 can have (e.g., 300–350 mm). This, in turn, limits a size of SLM 102. Throughput is based on the size of SLM 102. Thus, by restricting the size of SLM 102 because of optical element 108, throughput is much lower than what could be obtained if a diameter of SLM 102 was increased.

Therefore, what is needed is a maskless lithography system having an SLM with any sized diameter, which is also not limited by a size of an optical element that may be used to project light onto and off of the SLM.

SUMMARY OF THE INVENTION

The present invention provides a maskless lithography system including an illuminating system, a non-linear (e.g., curved, concave, spherical, etc.) SLM, an exposure system, and a beam splitter that directs light from the illuminating system to the SLM and from the SLM to the exposure system. In some embodiments, one or more optical elements can be located between the beam splitter and the SLM, possibly to correct for aberrations.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
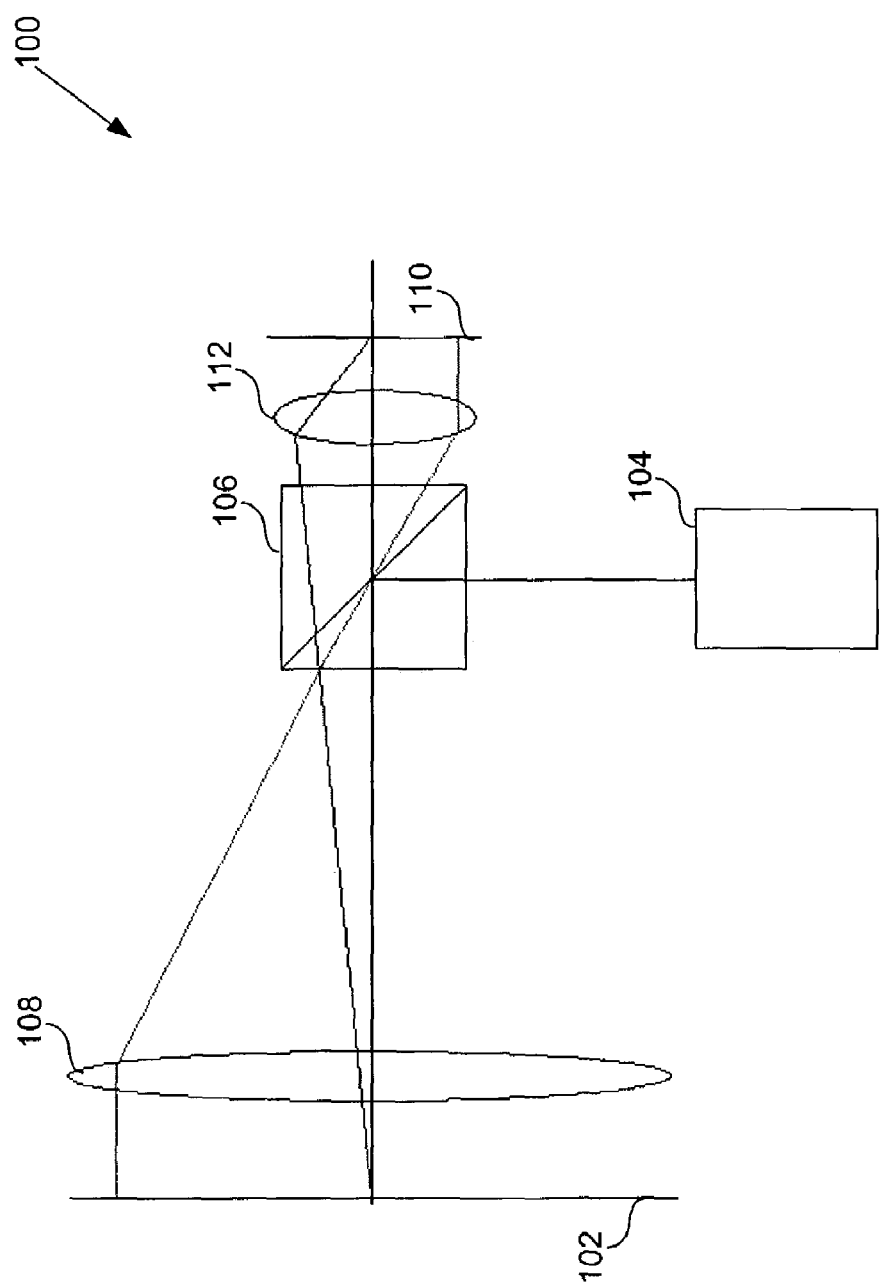
FIG. 1 shows a conventional maskless lithography system

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

The present invention provides a maskless lithography system. The maskless lithography system includes an illuminating system, a SLM having a non-linear shape (e.g., curved, concave, spherical, etc.), an exposure system, and a beam splitter that directs light from the illuminating system to the SLM and from the SLM to the exposure system. In some embodiments, one or more optical elements can be located between the beam splitter and the SLM, possibly to correct for aberrations.

For example, an increase of a radius of SLM by X results in a throughput increase of $X^2$. Also, the size, number, and costs of elements in the system are reduced because there is no requirement for an optical element between the beam splitter and the SLM. Even when an optical element is used, it will have a relatively smaller size, which can dramatically reduce the cost of producing the optical element. An overall system cost can be reduced as well by either not requiring the optical element or reducing its size.

Maskless Lithography Systems

Figure 2:
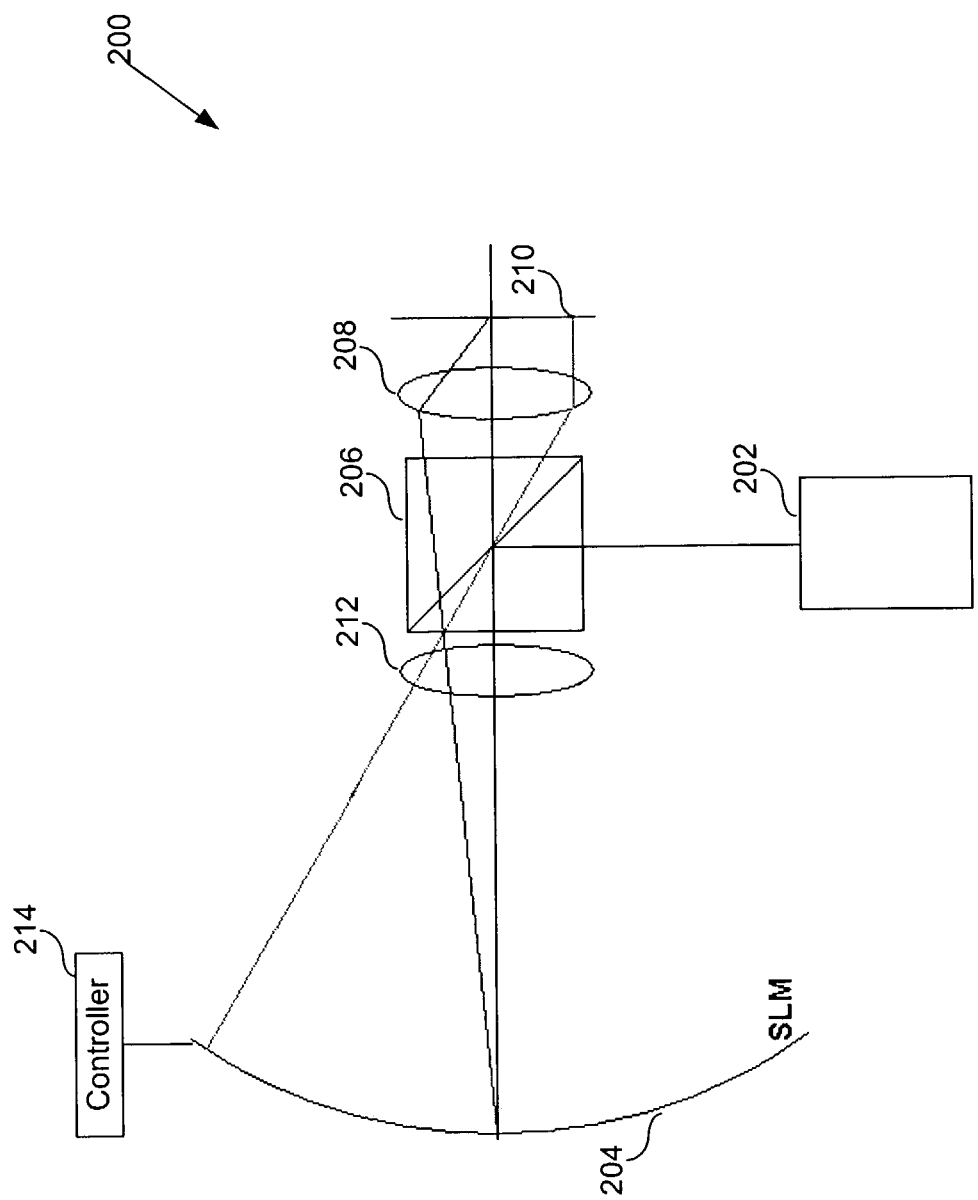
FIG. 2 shows a maskless lithography system according to embodiments of the present invention.

FIG. 2 shows a maskless lithography system 200 according to an embodiment of the present invention. System 200 includes an illumination system 202 that transmits light to a non-linear shaped (e.g., curved, spherical, concave, etc.) spatial light modulator 204 (e.g., a digital micro mirror device (DMD), a reflective liquid crystal display (LCD), or the like) via a beam splitter 206. Patterned light reflected from SLM 204 is passed through beam splitter 206 and projection optics (not shown) having at least an optical element 208 and written on an object 210 (e.g., a substrate, a semiconductor wafer, a glass substrate for a flat panel display, or the like).

It is to be appreciated that illumination optics can be housed within illumination system 202, as is known in the relevant art. It is also to be appreciated that an optical system (not shown) including at least an optical element 212 can be positioned before SLM 204 to perform known functions, such as correct for aberrations. Optical element 212 can be much smaller in comparison to optical element 108 in system 100 because it is no longer being used to make beams telecentric. Instead the chief rays of beams hit the SLM surface at small angles of incidence and therefore they are convergent rather than telecentric in the SLM space. Decreasing a size of optical element 212 also decreases its cost, and that of system 200.

Figure 3:
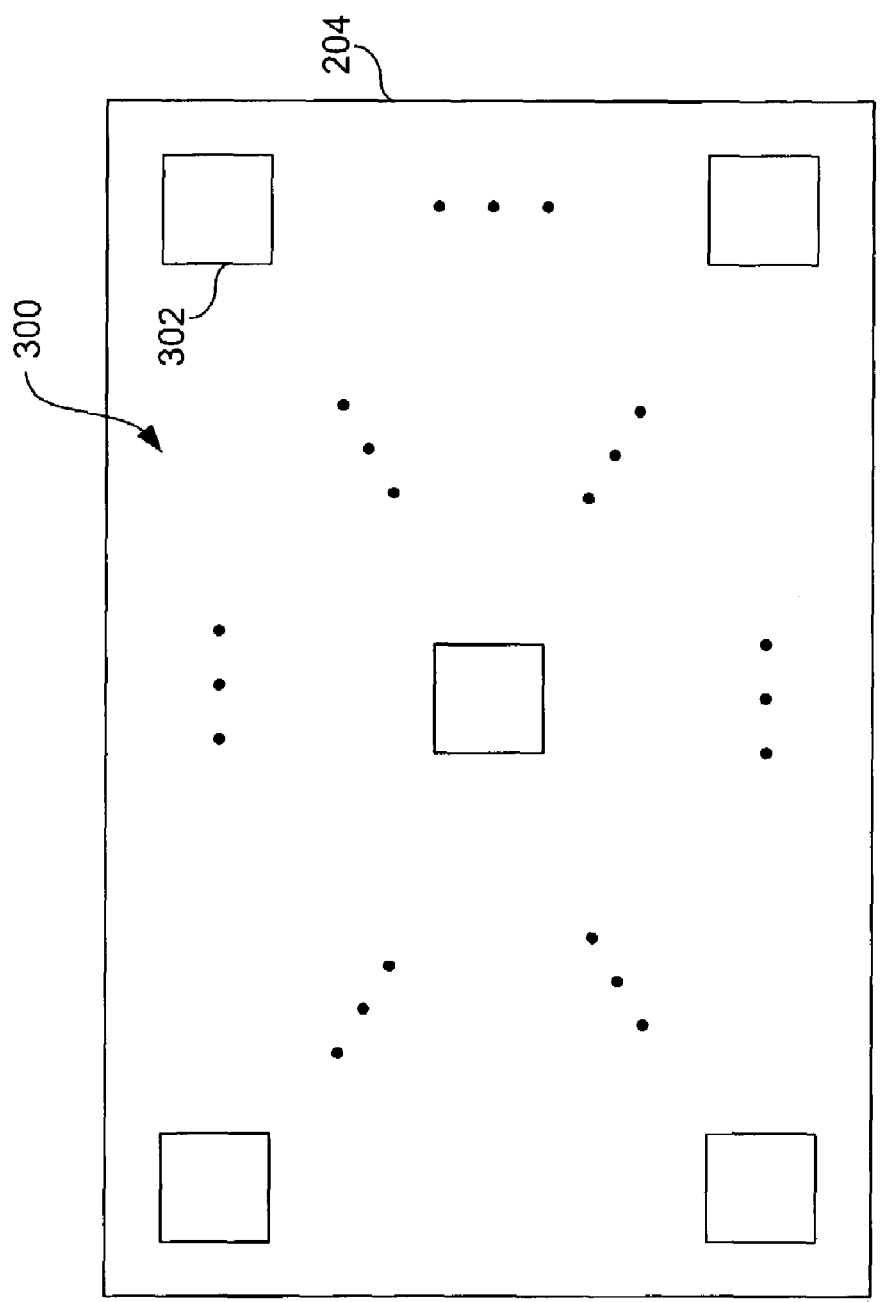
FIG. 3 shows a planar view of a spatial light modulator according to an embodiment of the present invention.

FIG. 3 shows details of an active area 300 of SLM 204. Active area 300 includes an array of active devices 302 (represented by dotted patterns in the figure). Active devices 302 can be mirrors on a DMD or locations on a LCD. It is to be appreciated that active devices 302 can also be referred to as pixels, as is known in the relevant art. By adjusting the physical characteristics of active devices 302, they can be seen as being either ON or OFF, or if they are not binary devices, as being somewhere in between fully ON and fully OFF. Digital or analog input signals based on a desired pattern are used to turn ON and OFF various active devices 302. In some embodiments, an actual pattern being written to object 112 can be detected and a determination can be made whether the pattern is outside an acceptable tolerance. If so, a controller 214 (FIG. 2) can be used to generate analog or digital control signals in real time to fine-tune (e.g., calibrate, adjust, etc.) the pattern being generated by SLM 204.

When a DMD is used as SLM 204, each pixel 302 can be mounted so as to be pivotable about resilient devices (not shown) which are located at two diagonal corners of each pixel 302. In operation, when an appropriate ON voltage is applied to pixel 302, an upper left-hand corner of pixel 302 will move upwardly from the plane of SLM 302, while a lower right-hand corner will move downwardly. Similarly, when an OFF voltage is applied, pixel 302 will pivot about the resilient devices so that the upper left-hand corner moves downwardly and the lower right-hand corner moves upwardly. Thus the ON and OFF positions comprise two distinct movements of each pixel 302. In one example, pixels 302 can be pivoted by 10 degrees to either side of planar.

Similarly, a liquid crystal display panel can be used as the SLM 204. Voltage would either be applied or cutoff from active areas 302 to either turn then ON or OFF, depending on the configuration of a control system (not shown) controlled by controller 214. When turned ON, light interacts with active areas 302 to direct a reflected beam towards object 210. When turned OFF, light interacts with active areas 302 to direct a reflected beam away from object 210.

SLM 204 is configured to allow all active area 300 to conform to a non-linear support or surface of SLM 204. In this configuration, a chief ray of each beam can strike each active area 302 at normal. Beams reflecting from SLM 204 converge onto beam splitter 206 without requiring an optical element 212 based on the shape of SLM 204. This is in contrast to conventional system 100 discussed above, where optical element 108 was required. Thus, system 200 is less complex and less costly compared to conventional system 100. Also, without the requirement of optical element 212, SLM 204 can be manufactured to have any radius needed for a particular system. As discussed above, an increase of X in a radius of SLM 204 equates to an increase of $X^2$ in throughput. Thus, for example, increase the radius 3 times allow for a 9 fold increase in throughput.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A system, comprising:
  an illumination system that supplies a beam of radiation;
  a spatial light modulator that patterns the beam, the spatial light modulator including,
    a non-linear substrate, and
    an array of individually controllable elements coupled to the non-linear substrate;
  a projection system that projects the patterned beam onto a substrate;
  a directing device that directs the beam onto the spatial light modulator and the patterned beam onto the projection system; and
  a focusing optical element that focuses the beam from the directing device onto the spatial light modulator, wherein a radius of the focusing element is substantially smaller than a radius of the spatial light modulator.

2. The system of claim 1, wherein a chief ray of the beam impinges each element in the array of individually controllable elements normal to a surface of each of the elements.

3. The system of claim 1, wherein the directing device comprises a means for correcting aberrations in the beam.

4. The system of claim 1, wherein the non-linear substrate has a curved shape.

5. The system of claim 1, wherein the non-linear substrate has a concave shape.

6. The system of claim 1, wherein the non-linear substrate has a spherical shape.

* * * * *